United States Patent
Hsieh et al.

(10) Patent No.: US 9,947,678 B2
(45) Date of Patent: *Apr. 17, 2018

(54) WING-TYPE PROJECTION BETWEEN NEIGHBORING ACCESS TRANSISTORS IN MEMORY DEVICES

(71) Applicant: Taiwan Semiconductor Manufacturing Co., Ltd., Hsin-Chu (TW)

(72) Inventors: Chia-Ta Hsieh, Tainan (TW); Chi-Wei Ho, Tainan (TW); Kao-Chao Lin, Fanlu Township (TW); Josh Lin, Tainan (TW); Nai-Chao Su, Tainan (TW); Shih-Jung Tu, Tainan (TW); Po-Kai Hsu, Tainan (TW); Shih-Ching Lee, Taichung (TW); Chen-Ming Huang, Tainan (TW)

(73) Assignee: Taiwan Semiductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/237,906

(22) Filed: Aug. 16, 2016

(65) Prior Publication Data

US 2016/0358930 A1 Dec. 8, 2016

Related U.S. Application Data

(62) Division of application No. 14/526,711, filed on Oct. 29, 2014, now Pat. No. 9,437,603.

(Continued)

(51) Int. Cl.
*G11C 11/34* (2006.01)
*H01L 27/11526* (2017.01)
(Continued)

(52) U.S. Cl.
CPC ...... *H01L 27/11526* (2013.01); *H01L 23/528* (2013.01); *H01L 27/0207* (2013.01);
(Continued)

(58) Field of Classification Search
CPC ......... H01L 27/11526; H01L 27/11521; H01L 23/528; H01L 29/0642
(Continued)

(56) References Cited

U.S. PATENT DOCUMENTS 5,862,082 A * 1/1999 Dejenfelt ............. H01L 27/115
257/E27.103
5,910,912 A * 6/1999 Hsu ..................... G11C 16/0425
257/321

(Continued)

OTHER PUBLICATIONS

Notice of Allowance dated May 6, 2016 for U.S. Appl. No. 14/526,711.

*Primary Examiner* — Viet Q Nguyen
(74) *Attorney, Agent, or Firm* — Eschweiler & Potashnik, LLC

(57) ABSTRACT

A flash memory device is disposed on a semiconductor substrate. The flash memory device includes flash memory cells arranged in rows and columns. Respective flash memory cells include respective access transistors and respective floating gate transistors. The respective access transistors have respective access gates, and the respective floating gate transistors have respective control gates arranged over respective floating gates. First and second wordlines extend substantially in parallel with one another and correspond to first and second rows which neighbor one another. The first wordline is coupled to access gates of access transistors along the first row. The second wordline is coupled to access gates of access transistors along the second row. Nearest edges of the first and second wordlines include at least one wing which extends laterally outward from a sidewall of one of the first and second wordlines towards a sidewall the other of the first and second wordlines.

20 Claims, 11 Drawing Sheets

Related U.S. Application Data

(60) Provisional application No. 62/062,345, filed on Oct. 10, 2014.

(51) Int. Cl.
    *H01L 27/11521*     (2017.01)
    *H01L 23/528*     (2006.01)
    *H01L 29/06*     (2006.01)
    *H01L 27/02*     (2006.01)
    *H01L 27/11519*     (2017.01)

(52) U.S. Cl.
    CPC .. *H01L 27/11519* (2013.01); *H01L 27/11521* (2013.01); *H01L 29/0642* (2013.01); *H01L 2924/0002* (2013.01)

(58) Field of Classification Search
    USPC ............. 365/185.17, 51, 63; 257/316, 390
    See application file for complete search history.

(56) References Cited

U.S. PATENT DOCUMENTS

| | | | | |
|---|---|---|---|---|
| 5,986,931 A * | 11/1999 | Caywood | ............... | H01L 27/115 257/E27.103 |
| 6,228,718 B1 * | 5/2001 | Huang | ............... | H01L 27/11521 257/E21.682 |
| 6,757,196 B1 * | 6/2004 | Tsao | ............... | G11C 16/0433 257/E27.103 |
| 7,095,651 B2 * | 8/2006 | Shirota | ............... | G11C 16/0433 257/E21.691 |
| 8,139,408 B2 * | 3/2012 | Georgescu | .......... | G11C 16/0458 365/185.01 |
| 8,946,806 B2 * | 2/2015 | Tan | ................ | H01L 27/11521 257/314 |
| 9,437,603 B2 * | 9/2016 | Hsieh | ............. | H01L 27/11519 |
| 9,472,645 B1 * | 10/2016 | Tseng | ............. | H01L 29/6656 |
| 2002/0000602 A1 * | 1/2002 | Lee | ............... | H01L 21/28273 257/314 |
| 2003/0198086 A1 * | 10/2003 | Shukuri | ............ | B82Y 10/00 365/185.18 |
| 2005/0026365 A1 * | 2/2005 | Ding | ............ | H01L 21/28273 438/257 |
| 2005/0026366 A1 * | 2/2005 | Ding | ................ | H01L 27/105 438/258 |
| 2005/0110073 A1 * | 5/2005 | Spadea | .......... | G11C 16/0416 257/315 |
| 2007/0221960 A1 * | 9/2007 | Ashida | ........... | H01L 27/105 257/213 |
| 2009/0296447 A1 | 12/2009 | Verhaar et al. | | |
| 2010/0044773 A1 * | 2/2010 | Ishigaki | ........... | H01L 27/11521 257/320 |
| 2015/0048439 A1 * | 2/2015 | Shum | ............... | H01L 29/7816 257/326 |
| 2015/0087123 A1 * | 3/2015 | Wu | ................ | H01L 21/76802 438/257 |

\* cited by examiner

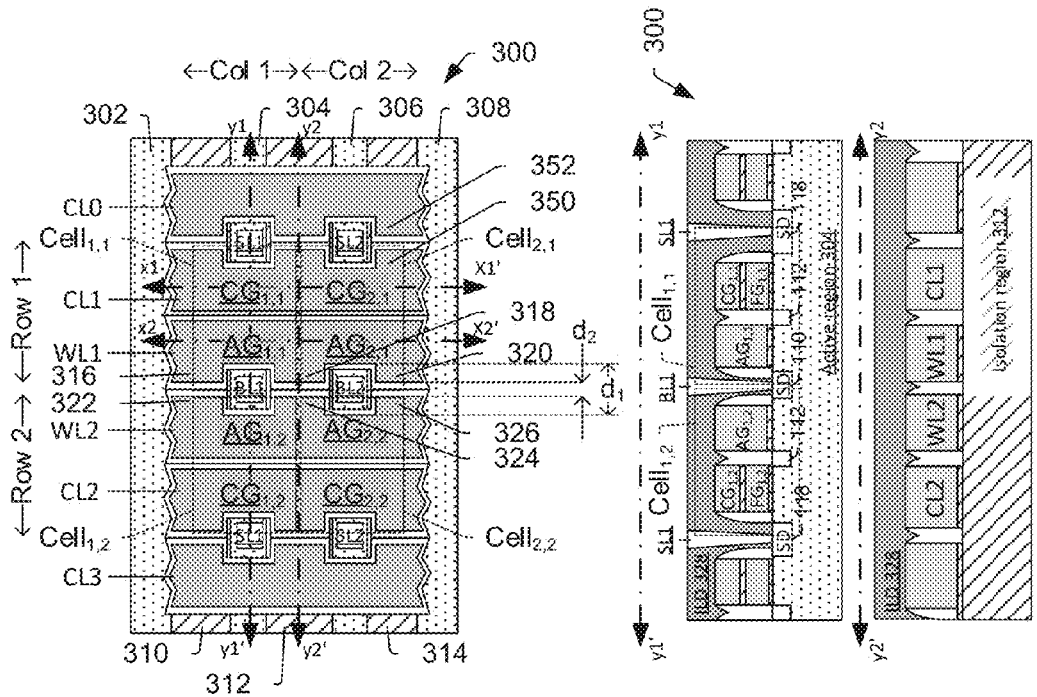
FIG. 3A
FIG. 3B
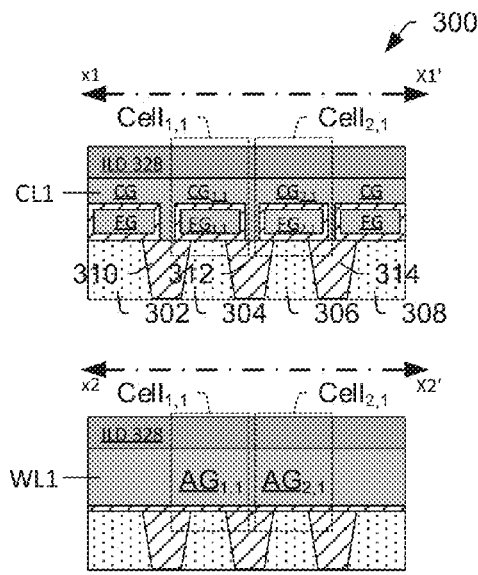
FIG. 3C

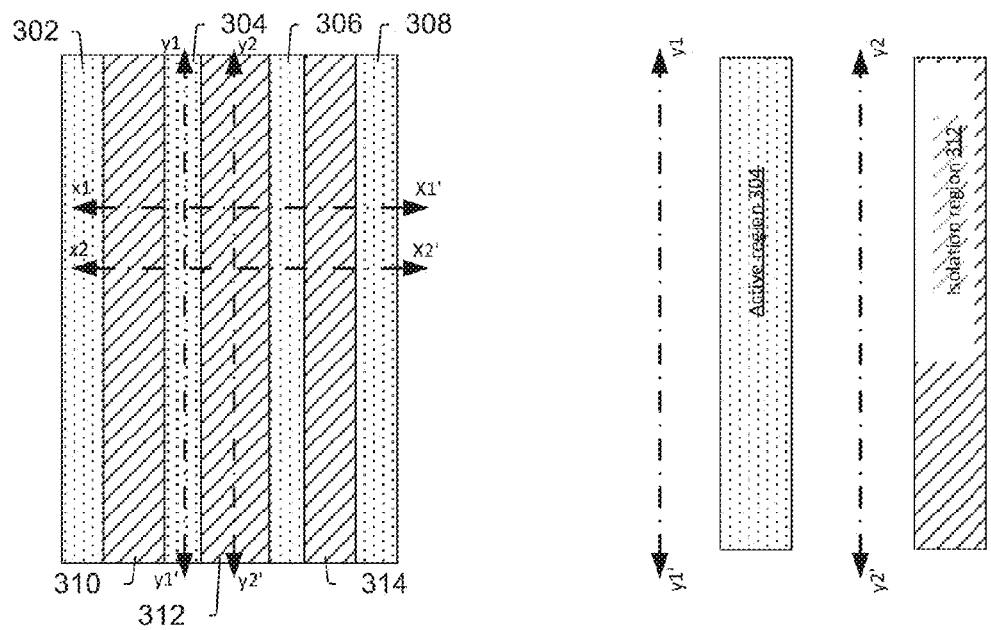
FIG. 7A
FIG. 7B
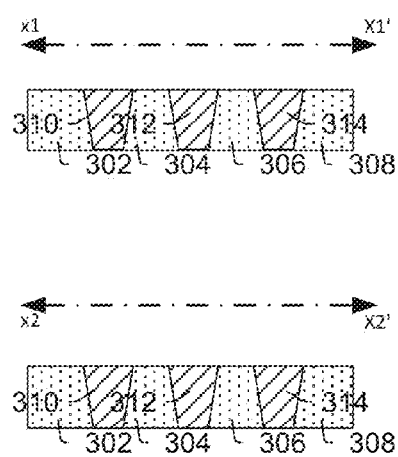
FIG. 7C

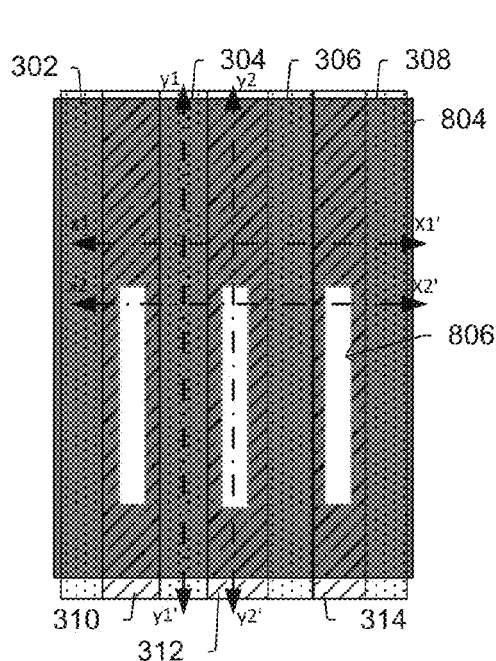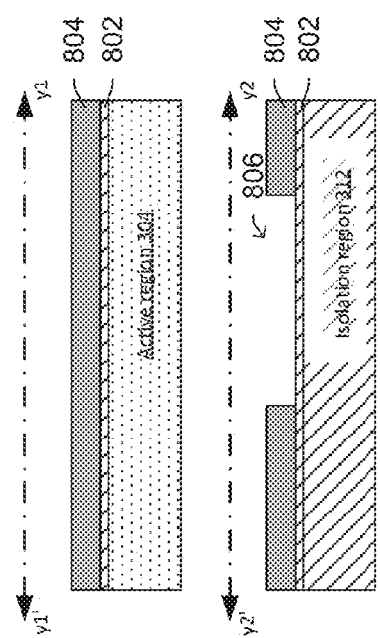
FIG. 8A
FIG. 8B
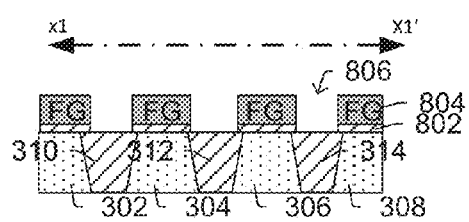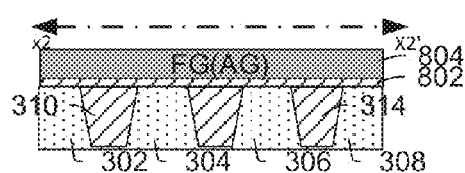
FIG. 8C

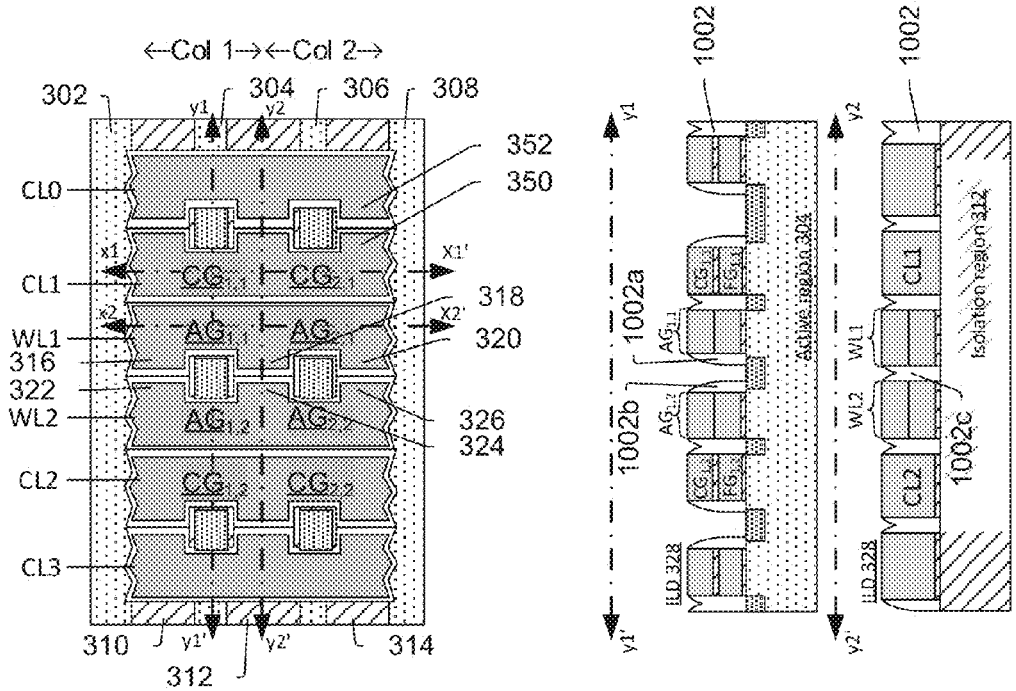
FIG. 10A
FIG. 10B
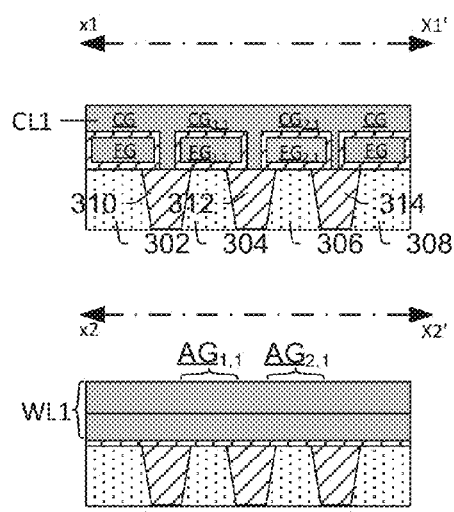
FIG. 10C

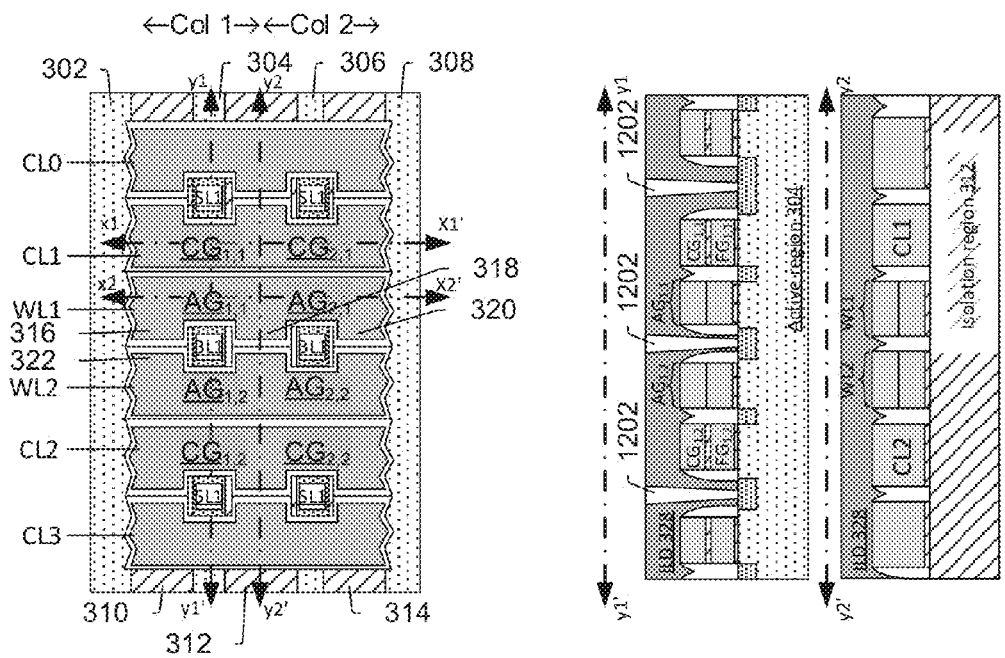
FIG. 12A
FIG. 12B
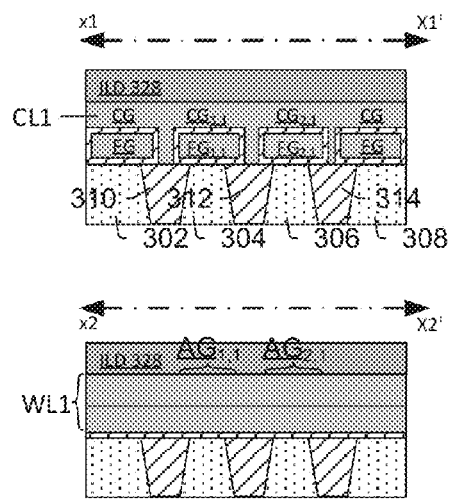
FIG. 12C

| Mode | Selected WL $V_{CL}$ | Selected WL $V_{WL}$ | Non-Selected WL $V_{CL}$ | Non-Selected WL $V_{WL}$ | $V_{SL}$ | $V_{BL}$ | $V_{pwell}$ | $V_{nwell}$ |
|---|---|---|---|---|---|---|---|---|
| Program | -7 V to -11 V | 8 V | 0 V | 0 V | High Z | 5 V to 8V | 0 V | 3.3 V |
| Program Inhibit | -7 V to -11 V | 8 V | 0 V | 0 V | High Z | 0 V | 0 V | 3.3 V |
| Erase | 8 V to 10 V | 0 V |  |  | -8 V to -10 V | High Z | 8 V to 10 V | 3.3 V |
| Read | 3.3 V | 3.3 V | 0 V | 0 V | 0 V | 1 V | 0 V | 3.3 V |

FIG. 13

WING-TYPE PROJECTION BETWEEN NEIGHBORING ACCESS TRANSISTORS IN MEMORY DEVICES

REFERENCE TO RELATED APPLICATIONS

This Application is a Divisional of U.S. application Ser. No. 14/526,711 filed on Oct. 29, 2014, which claims priority to U.S. Provisional Application No. 62/062,345 filed on Oct. 10, 2014. The contents of both applications are hereby incorporated by reference in their entirety.

BACKGROUND

Flash memory is an electronic non-volatile computer storage medium that can be electrically erased and reprogrammed. Flash memory is used in a wide variety of applications, ranging from portable flash memory sticks, to digital cameras, to radios, to any number of other devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a top (layout) view of a portion of a flash memory array in accordance with some embodiments.

FIG. 3B illustrates two cross-sectional views of FIG. 3A's flash memory array along a first direction in accordance with some embodiments.

FIG. 3C illustrates two cross-sectional views of FIG. 3A's flash memory array along a second direction in accordance with some embodiments.

FIGS. 7A-7C through 12A-12C illustrate top views and corresponding cross-sectional views, which collectively depict a method of manufacturing a flash memory array in accordance with some embodiments.

FIG. 13 illustrates a table showing example bias voltage conditions to write and read to and from an array of flash memory cells.

DETAILED DESCRIPTION

Figure 1:
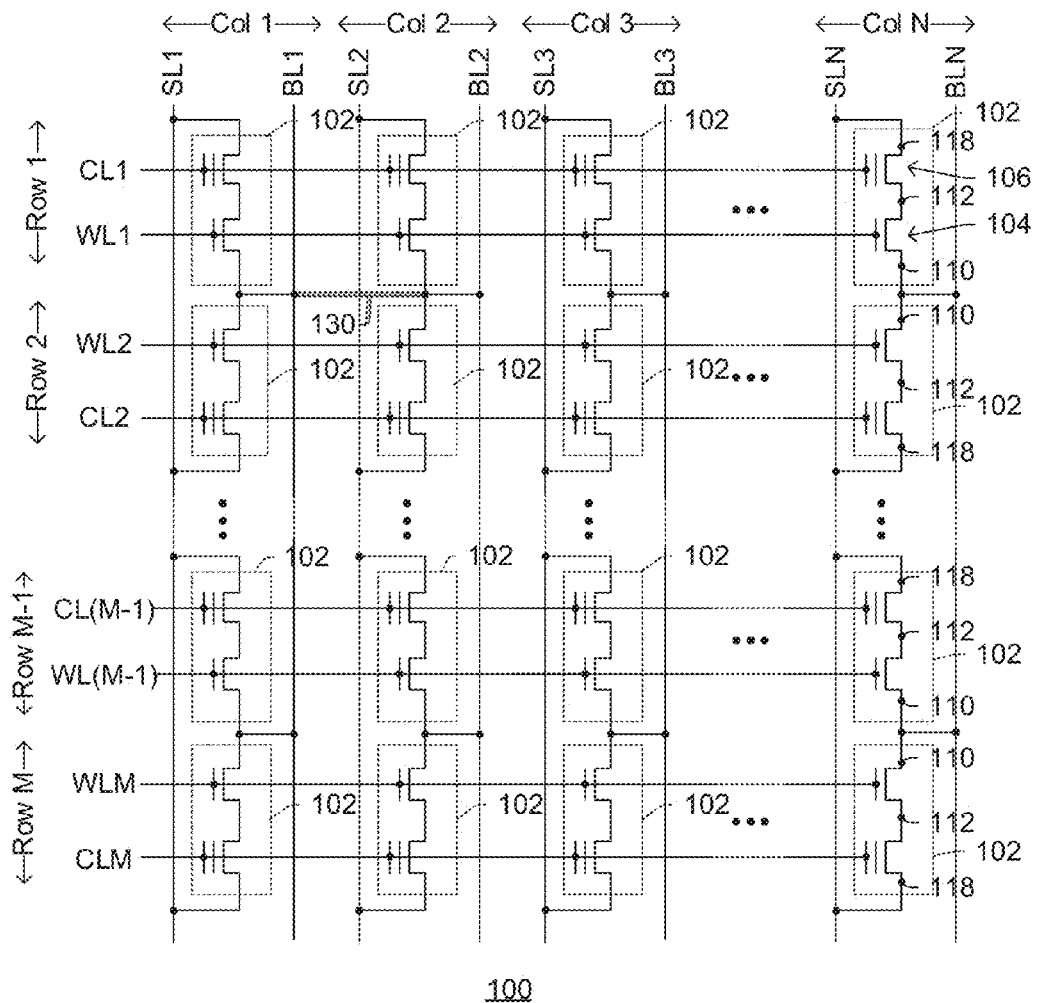
FIG. 1 illustrates a schematic view of some embodiments of a memory array made up of 2-transistor (2T) flash memory cells.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
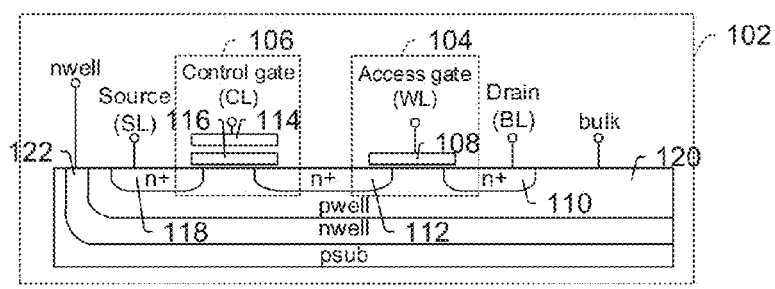
FIG. 2 illustrates a cross-sectional view of some embodiments of a 2T flash memory cell.

FIG. 1 illustrates a schematic drawing of a flash memory array 100 made up of a number of two transistor (2T) flash memory cells 102 arranged in M rows and N columns. In general, M and N can be any positive integers and M can be equal to N or different from N. Referring briefly to FIG. 2, each 2T flash memory cell 102 includes an access transistor 104 and a floating gate transistor 106 which are connected in series. The access transistor 104 includes a conductive access gate (AG) 108 arranged between an individual AG source/drain region 110 and a common source/drain region 112. The floating gate transistor 106 includes a control gate 114 arranged and isolated from a floating gate (FG) 116, which is arranged between the common source/drain region 112 and an individual FG source/drain region 118.

Referring back to FIG. 1, for each column, a source line SL is coupled to the individual FG source/drain regions 118 along the column, and a bit line BL is coupled to individual AG source/drain regions 110 along the column. For example, in column N, SLN and BLN are coupled to FG source/drains 118 and AG source/drains 110, respectively, for all memory cells 102 along column N. For each row, a control line CL is coupled to respective control gates of respective floating gate transistors along the row, and a wordline is coupled to respective access gates of respective access transistors along the row. For example, in row 1, WL1 and CL1 are coupled to access gates and control gates, respectively, for all memory cells 102 along row 1.

Although such 2T flash memory arrays are sufficient in many regards, the applicants have appreciated that previous layouts are prone to having bitlines of neighboring memory cells along a given row being undesirably shorted together during manufacturing (see dashed line 130 in FIG. 1). This undesirable condition can occur, for example, if wordlines along neighboring rows, for example WL1 and WL2 along Row 1 and Row 2 in FIG. 1, are sufficiently close that long and continuous voids or channels are inadvertently formed between neighboring edges of the wordlines when an interlayer dielectric (ILD) is deposited. When contact holes are later formed through the ILD, the contact holes can encounter the long and continuous voids, such that the contact holes and voids can collectively establish a continuous open channel between the contacts. When the contacts holes are later filled with metal, such as tungsten for example, the continuous open channel can also be filled to form a continuous conductive path between neighboring contacts, which inadvertently shorts the neighboring contacts to one another and can lead to failure of the corresponding memory cells. This condition is believed to have been largely unknown, let alone mitigated, until now.

FIG. 3A shows a layout view of a flash memory array 300 that mitigates inadvertent shorts in accordance with some embodiments. Like the schematic of FIG. 1, the flash memory array 300 is made up of a number of 2T flash memory cells arranged in rows and columns. For clarity, FIG. 3A includes four memory cells that are labeled as Cell$_{Column,Row}$ (e.g., Cell$_{1,1}$; Cell$_{1,2}$; Cell$_{2,1}$; Cell$_{2,2}$), but it will be appreciated that the array 300 can be extended to any number of such cells. Each 2T flash memory cell includes an access transistor, which has an access gate (AG), as well as a floating gate transistor, which has a control gate (CG) arranged over a floating gate (FG). For clarity, in FIGS. 3A-3C, access gates, control gates, and floating gates have been labeled with subscripts denoting their respective columns and rows. For example, CG$_{1,1}$ is a control gate for the memory cell (Cell$_{1,1}$) at the intersection of column 1 and row 1, while CG$_{2,1}$ is a control gate for the memory cell (Cell$_{2,1}$) in column 2 and row 1.

A plurality of control lines (CLs) extend over the semiconductor substrate in a first direction (e.g., x-direction) and are coupled to respective control gates (CGs) along respective rows. For example, in Row 1, control line 1 (CL1) is coupled to control gates CG$_{1,1}$ and CG$_{2,1}$, and can extend to other cells of the row (not shown). Similarly a plurality of wordlines extends over the semiconductor substrate parallel with the control lines and are coupled to respective access gates (AGs) along respective rows. For example, in Row 1, wordline 1 (WL1) is coupled to access gates AG$_{1,1}$ and AG$_{2,1}$ and can extend to other cells of the row (not shown).

A plurality of active regions (e.g., 302, 304, 306, 308) are disposed in the semiconductor substrate in a second direction (e.g., y-direction) and are arranged to be perpendicular to the wordlines. Neighboring active regions are spaced apart from one another by respective isolation structures (e.g., 310, 312, 314).

The control lines and wordlines are arranged so pairs of neighboring control lines (e.g., CL0, CL1) alternate with pairs of neighboring wordlines (WL1, WL2). Nearest edges of first and second wordlines of a neighboring pair include one or more "wings" which extend laterally outward from a sidewall of one of the first or second wordlines towards a sidewall of the other of the first or second wordlines. For example, WL1 includes wings 316, 318, and 320; and WL2 includes wings 322, 324, and 326. Notably, during manufacture these wings 316-326 prevent the formation of any long and continuous voids between the neighboring wordlines (e.g., WL1, WL2), wherein such voids could otherwise run between adjacent contacts (e.g., BL1, BL2 contacts) when the ILD 328 is formed. Thus, these wings prevent the formation of undesirable metal piping between adjacent contacts (e.g., see 130 in FIG. 1), and can thereby improve the memory cell yield for memory arrays.

The wings can manifest in a variety of shapes and sizes. In FIG. 3's embodiment, the wings 316-326 are positioned symmetrically between adjacent pairs of contacts (e.g., BL1, BL2 contacts) to prevent formation of undesired metal piping therebetween. In particular, the pair of contacts BL1, BL2 are arranged between the nearest edges of the first and second wordlines WL1, WL2, and extend vertically downward from bitlines (e.g., BL1 or BL2) to underlying AG source/drain regions (e.g., 110). The nearest edges of first and second wordlines are separated by a first perpendicular distance, d$_1$, measured through or over a contact and are separated by a second, smaller perpendicular distance, d$_2$, when measured at a position other than through or over the contact.

It will be appreciated that although the control lines, source lines, bitlines, etc. are described herein as being "lines", these "lines" are not limited to solely continuous linear paths, but may include jogs, turns, and the like. In this regard, the "lines" are merely a conductive conduit to carry signals, such as a voltage or current signal, over an integrated circuit. Often, these lines are implemented in a single layer of metal or otherwise conducting layer, such as doped polysilicon. Further, such lines can manifest as a continuous horizontal or conformal metal, such as a polysilicon layer, metal 1 layer, metal 2 layer or the like, or can include multiple layers, such as a poly1 and poly2 layer that abut one another. That being said, in some implementations solely linear segments are advantageous as they can help provide a small footprint for the memory device. It is also noted that the illustrated control lines include control lines wings (e.g., 350, 352) extending between neighboring control lines. Although structurally similar, the purpose of the CG wings is to improve coupling ratios for floating gate transistors, whereas the access gate wings are introduced herein to mitigate inadvertent shorts.

Figure 4:
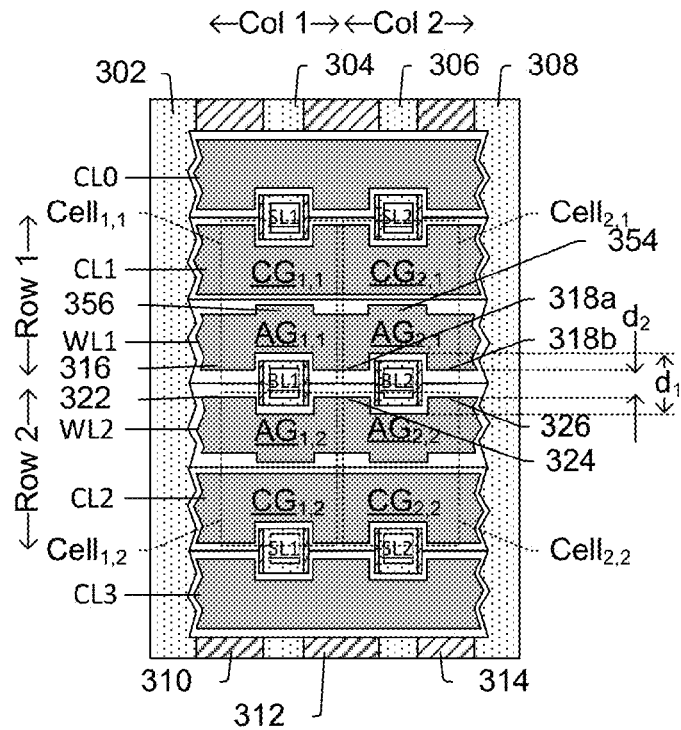
FIGS. 4-5 show some alternate layout views of flash memory arrays in accordance with some embodiments.
Figure 5:
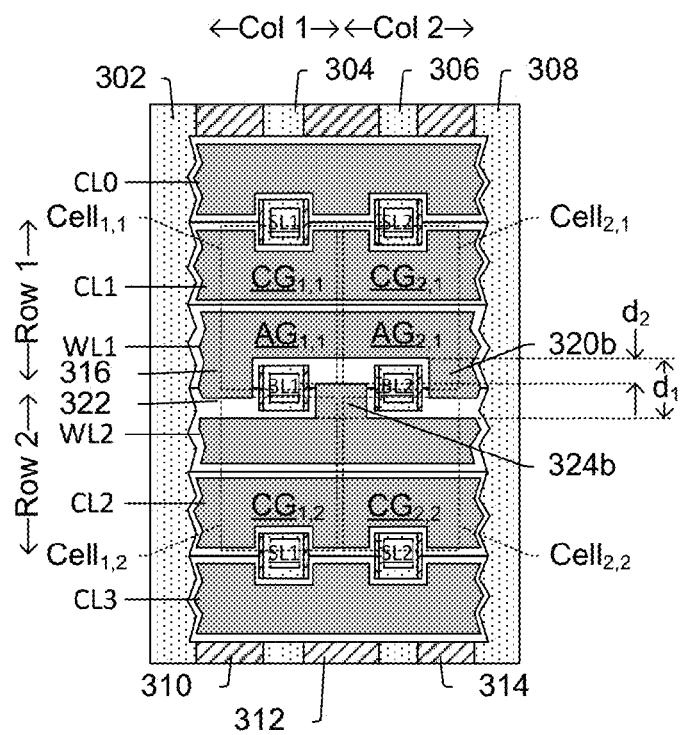

FIGS. 4-5 show some alternate arrangements of lateral AG "wings" in accordance with some embodiments. In FIG. 4, the AG wings alternate between one side of a wordline and an opposite side of the wordline. Thus, wings 318a, 318b are positioned on a first side of WL1 which is adjacent to WL2; while wings 354, 356 are positioned on a second opposite side of WL1 which is adjacent to CL1. Wings on the neighboring wordline WL2 are symmetric with regards to those on WL1, albeit mirrored about an axis of symmetry passing through contacts BL1, BL2.

In FIG. 5, rather than each of the neighboring WLs having wings that extend laterally towards one another in symmetric fashion, the wings are staggered asymmetrically about an axis passing through the contacts. Thus, wing 324b extends from WL2 towards a planar sidewall of WL1 (wherein WL1 does not have a corresponding symmetric wing thereat), and is arranged between contacts BL1, BL2. Another wing 320b extends from WL1 towards a planar sidewall of WL2 (wherein WL2 does not have a corresponding symmetric wing thereat).

Figure 6:
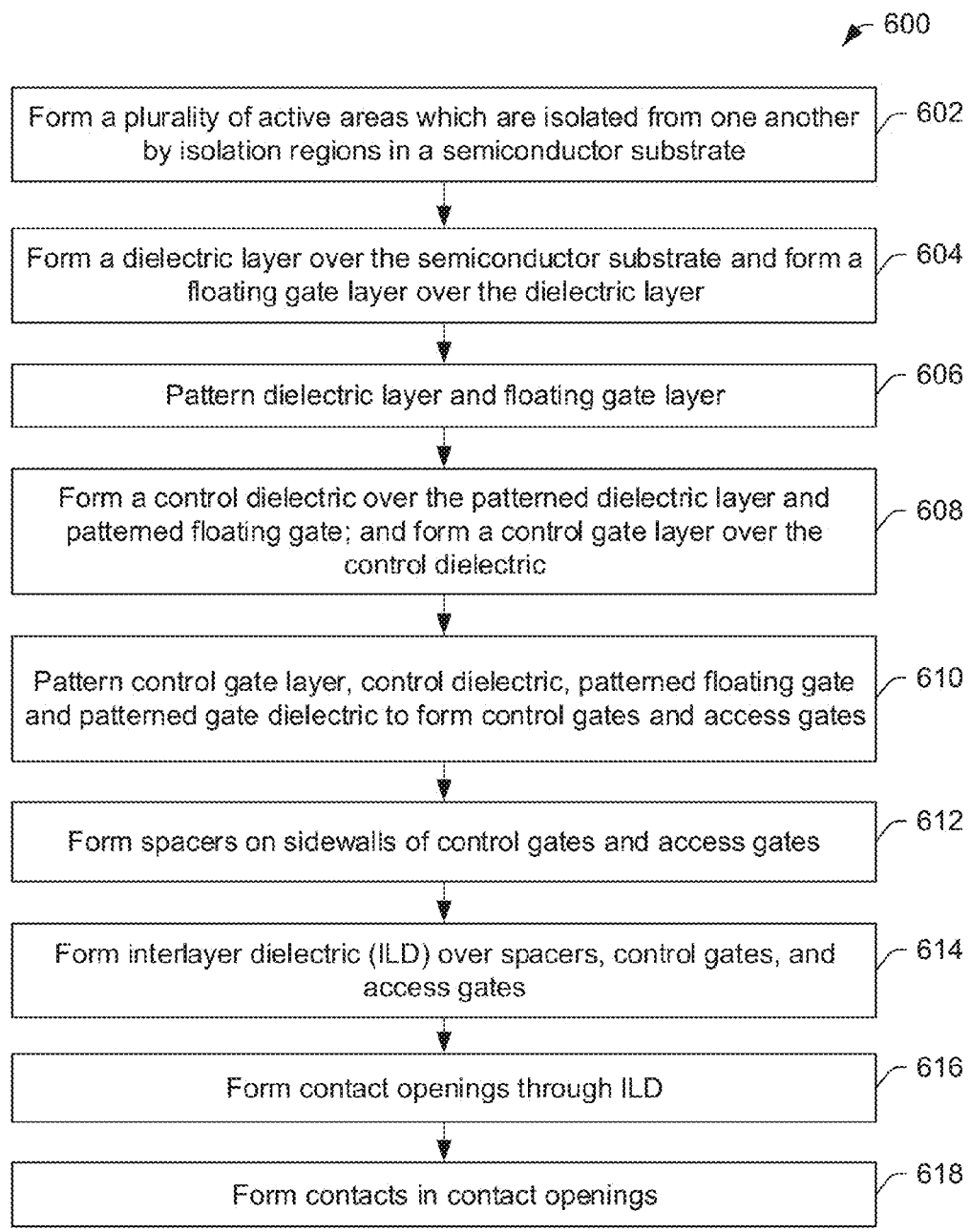
FIG. 6 illustrates some embodiments of a method to manufacture a flash memory array.

In FIG. 6 shows a flow diagram of some embodiments of a method 600 of forming an array of flash memory cells.

In 602, a plurality of active areas, which are isolated from one another by isolation regions, are formed in a semiconductor substrate. The semiconductor substrate can correspond to a bulk silicon wafer, a silicon-on-insulator (SOI) wafer, or sapphire substrate, among others. The active areas are doped semiconductor regions, which have a first conductivity type, and the isolation regions can be dielectric regions or doped semiconductor regions which have a second conductivity type.

In 604, a dielectric layer is formed over the semiconductor substrate, and a conductive floating gate layer, such as a first doped polysilicon (poly 1) layer, is formed over the dielectric layer.

In 606, a floating gate mask is patterned over the floating gate layer, and an etch is performed with the floating gate mask in place to thereby pattern the dielectric layer and floating gate layer.

In 608, a control dielectric is formed over the patterned dielectric layer and patterned floating gate. A control dielectric mask is then patterned over the control dielectric, and an etch is performed with the control dielectric mask in place to thereby pattern the control dielectric. A conductive control gate layer, such as a second doped polysilicon (poly 2) layer, is formed over the gate dielectric.

In 610, a control gate mask is patterned over the control gate layer, and an etch is performed with the control gate mask in place to thereby form control gates, floating gates, and access gates, along with wordlines coupling access gates and control lines coupling control gates.

In 612, spacers are formed on sidewalls of control gates and access gates. In some embodiments, the spacers are formed by conformally depositing a spacer material, for example a nitride material, over the existing structure, and then an anisotropic etch back process can be used to remove thin horizontal regions of the spacer material while leaving vertical sidewall spacers in place.

In 614, an interlayer dielectric (ILD) is formed over spacers, control gates, and access gates. The ILD can be a low-k dielectric or other dielectric material, such as silicon dioxide or another oxide.

In 616, contact openings are formed through the ILD.

In 618, contacts, such as tungsten plugs, are formed in the contact openings. Higher level interconnect is then formed.

While disclosed methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 7A-7C through 12A-12C, a series of cross-sectional views of some embodiments of the semiconductor structure at various stages of manufacture are provided. In these figures, figures with a suffix of "A" correspond to a top (layout) view, figures with a suffix of "B" correspond to two cross-sectional views along a first (e.g., y) direction, and figures with a suffix of "C" two cross-sectional views along a second (e.g., x) direction that is perpendicular to the first direction. Although FIGS. 7A-7C though 12A-12C are described in relation to the method 600, it will be appreciated that the structures disclosed in FIGS. 7A-7C through 12A-12C are not limited to the method 600, but instead may stand alone as structures independent of the method 600. Similarly, although the method 600 is described in relation to FIGS. 7A-7C through 12A-12C, it will be appreciated that the method 600 is not limited to the structures disclosed in FIGS. 7A-7C through 12A-12C, but instead may stand alone independent of the structures disclosed in FIGS. 7A-7C through 12A-12C.

In FIGS. 7A-7C, which are consistent with one example of block 602 in FIG. 6, a plurality of active areas 302-308, which are isolated from one another by isolation regions 310-314, are formed in a semiconductor substrate. The semiconductor substrate can correspond to a bulk silicon wafer, a silicon-on-insulator (SOI) wafer, or sapphire substrate, among others. The active areas 302-308 are doped semiconductor regions, which have a first conductivity type, and the isolation regions 310-314 can be dielectric regions or doped semiconductor regions which have a second conductivity type.

In FIGS. 8A-8C, which are consistent with one example of blocks 604-606 in FIG. 6, a dielectric layer 802 is formed over the semiconductor substrate. A conductive floating gate layer 804, such as a first doped polysilicon (poly 1) layer, is formed over the dielectric layer 802. After the conductive floating gate layer 804 is formed, a floating gate mask (not shown) is patterned over the floating gate layer, and an etch is performed with the floating gate mask in place to thereby pattern the dielectric layer and floating gate layer to form openings 806 therein. The dielectric layer 802 can act as a gate dielectric under access gate (AG) regions, and can act as a tunnel dielectric under floating gate (FG) and/or control gate regions. The gate dielectric and tunnel dielectric can be structurally the same in some implementations, but can differ in their respective materials or thicknesses in other implementations.

Figure 9A:
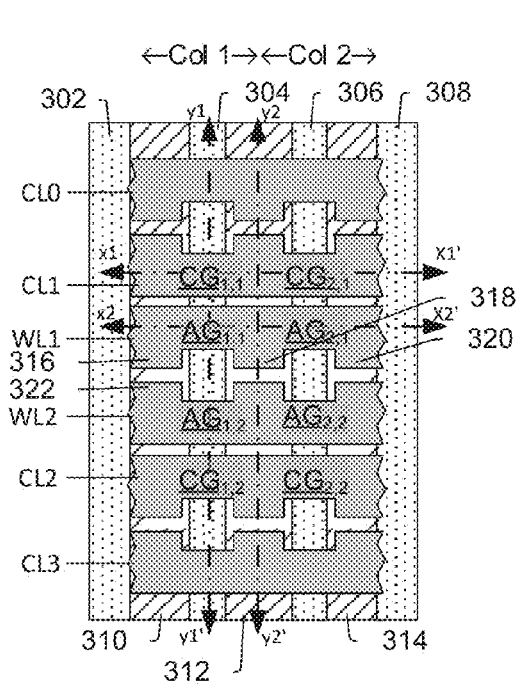
Figure 9B:
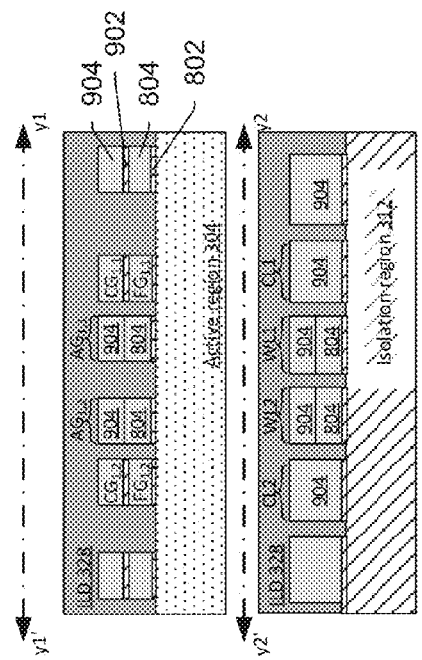
Figure 9C:
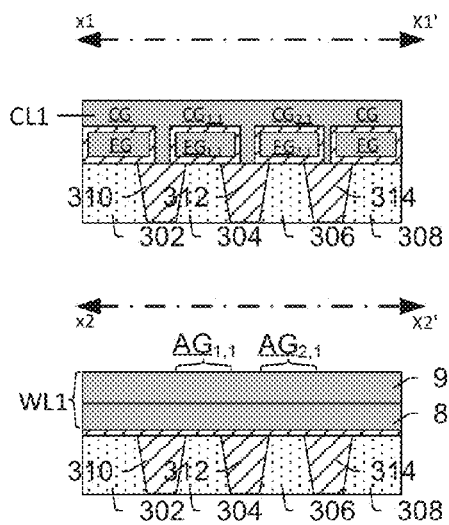

In FIGS. 9A-9C, which are consistent with one example of blocks 608-610 in FIG. 6, a control dielectric 902 is formed over the patterned floating gate layer 804. In some embodiments, the control dielectric 902 is an oxide-nitride-oxide (ONO) dielectric, but other dielectrics such as silicon dioxide or low-k dielectrics can also be used. A control dielectric mask (not shown) is then patterned over the control dielectric 902, and an etch is performed with the control dielectric mask in place to thereby pattern the control dielectric 902 and to remove the control dielectric 902 from over the wordlines and/or access gates (AG).

Still referring to FIGS. 9A-9C, a conductive control gate layer 904, such as a second doped polysilicon (poly 2) layer, is formed over the exposed portion of floating gate layer 804 (in the access transistor regions) and over the control dielectric 902 (in the floating gate transistor regions). After the control gate layer 904 is formed, a control gate mask (not shown) is patterned over the control gate layer 904, and an etch is performed with the control gate mask in place to thereby form control gates (CG), floating gates (FG), and access gates (AG); along with wordlines coupling access gates and control lines coupling control gates. For the access gates (AG), the control gate layer 904 can abut and be directly electrically coupled to the floating gate layer 804 such that these two layers collectively establish an access gate. The control gate layer 904 and floating gate layer 804 for this access gate can still exhibit a seam between their abutting surfaces and/or be structurally distinct in other ways, such as due to small non-planarities in their sidewalls at the interface of 804/904. In contrast, the control gates (CG) and floating gates (FG) for the floating gate transistors remain isolated by the control dielectric 902. The wordlines include wordline or access gate wings (e.g., 318, 320, 324, 326), while the control lines include control line or control gate wings (e.g., 350, 352).

In FIGS. 10A-10C, which are consistent with one example of block 612 in FIG. 6, ions of a second conductivity type are implanted to form source/drain regions 110, 112, 118. Spacers 1002 are formed on sidewalls of control lines and wordlines. In some embodiments, the spacers are formed by conformally depositing a spacer material, for example a nitride material, over the existing structure, and then an anisotropic etch back process can be used to remove thin horizontal regions of the spacer material while leaving vertical sidewall spacers 1002 in place. Adjacent to a first wing (e.g., 318), the sidewall spacers of the first and second wordlines abut one another (see spacers 1002c), while at a position spaced apart from the first wing the sidewall spacers of the first and second wordlines are spaced apart from one another (see spacers 1002a, 1002b).

Figure 11A:
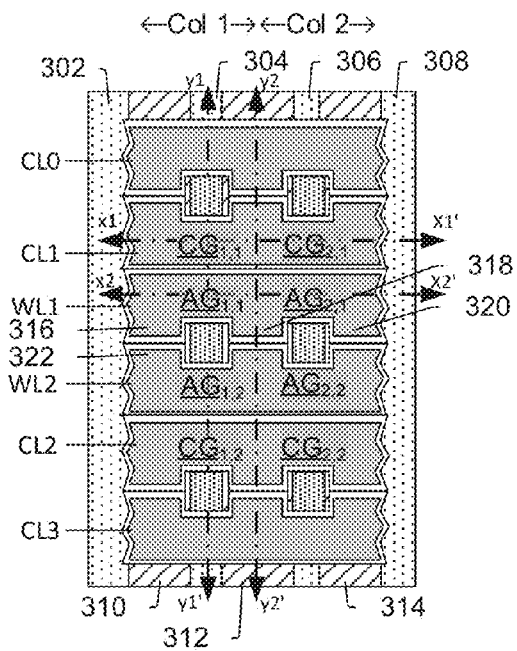
Figure 11B:
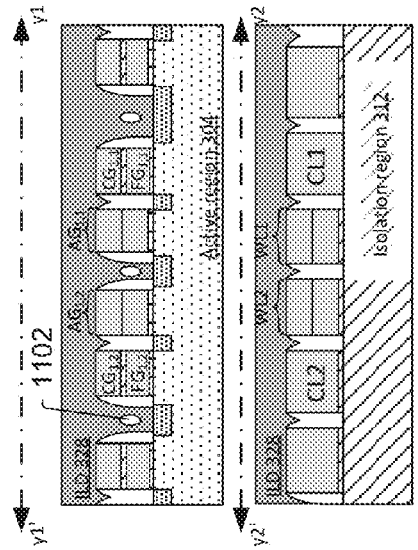
Figure 11C:
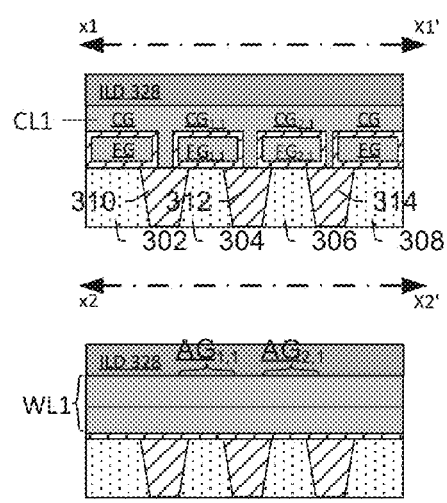

In FIGS. 11A-11C, which are consistent with one example of blocks 614 in FIG. 6, a source/drain implant having the second conductivity type is performed, and a silicide layer is formed over the source/drain regions. A contact etch stop layer (CESL) (not shown) is then conformally formed over the structure, after which an ILD 328 is formed. When a distance between neighboring sidewall spacers is small on the order of a source/drain dimension, voids 1102 may form.

Thus, by the first wing (e.g., 318) making spacers abut (see 1002c in FIG. 10A-10c), the first wing prevents formation of metal piping between contacts on opposite sides of the first wing.

FIGS. 12A-12C, which are consistent with one example of blocks 616-618 in FIG. 6, chemical mechanical polishing (CM) is performed on the ILD 328. A contact mask is then patterned over the planarized ILD, and an etch is carried out with the contact mask in place. A conductive metal plug 1202, such as a tungsten plug or other metal with good ductility and good fill characteristics, can be used to form an ohmic contact to the source/drain regions and silicide on an upper region thereof.

FIG. 13 is a table illustrating some sample voltage conditions for program, program inhibit, erase and read operations for array 100. It will be appreciated that this sample voltage conditions are merely an example and are in no way limiting. Actual voltages and relationships between voltage conditions can vary widely depending on memory architecture and device technology employed. During erase and program operations, the number of electrons stored on the floating gate of an accessed floating gate transistor are changed to alter the threshold voltage (Vt) of the floating gate transistor. For erase operations, for example, all the memory cells of a row (or even in the entire array 100) are erased simultaneously by applying a high voltage of 8 to 10 volts to the control line of a row (or all rows), and concurrently applying a negative high voltage of −8 to −10 volts to corresponding source lines. At the same time, the same negative high voltage −8 to −10 volts is applied to p-well 120, and Vcc supply voltage of 3.3 volts is applied to n-well 122. Thus, the erase operation increases the threshold voltage Vt of the floating gate transistors which are accessed.

It will be appreciated that although several embodiments have been described above with regards to a memory array made up of 2T flash cells, the concept is also applicable to other types of memory arrays. In such implementations, floating gate transistors of memory cells can be replaced by data storage elements, such as magneto-resistive data storage elements, ferroelectric data storage elements, capacitive data storage elements such as dynamic random access memory (DRAM), variable resistance data storage elements, phase change memory elements, static random access memory (SRAM), and read only memory (ROM), among others. In these other memories, the access transistors can allow selective access to the data storage elements to write to and/or read from the data storage elements.

In some embodiments, the present disclosure provides a flash memory device disposed on a semiconductor substrate. The flash memory device includes a plurality of flash memory cells arranged in rows and columns. Respective flash memory cells include respective access transistors coupled to respective floating gate transistors. The respective access transistors have respective access gates, and respective floating gate transistors have respective control gates arranged over respective floating gates. First and second wordlines extend substantially in parallel with one another and correspond to first and second rows which neighbor one another. The first wordline is coupled to respective access gates of respective access transistors along the first row. The second wordline is coupled to respective access gates of respective access transistors along the second row. Nearest edges of the first and second wordlines include at least one wing which extends laterally outward from a sidewall of one of the first and second wordlines towards a sidewall the other of the first and second wordlines.

In some embodiments, the present disclosure provides a flash memory device disposed on a semiconductor substrate. The flash memory device includes a plurality of flash memory cells arranged in rows and columns. Respective flash memory cells include respective access transistors coupled to respective floating gate transistors. The respective access transistors have respective access gates, and respective floating gate transistors have respective control gates arranged over respective floating gates. A plurality of control lines extend over the semiconductor substrate in a first direction and are coupled to respective control gates of respective floating gate along respective rows. A plurality of wordlines extend substantially in parallel with the respective control lines and are coupled to respective access gates of respective access transistors along respective rows. The control lines and wordlines are arranged so pairs of neighboring control lines alternate with pairs of neighboring wordlines. Nearest edges of first and second wordlines of a neighboring pair include a wing which extends laterally outward from a sidewall of one of the first or second wordlines towards a sidewall the other of the first or second wordlines.

In yet other embodiments, the present disclosure provides a memory array including a plurality of memory cells. The memory cells include respective access transistors and respective data storage elements, which are arranged in rows and columns on a semiconductor substrate. The substrate includes alternating active regions and isolation regions which extend in a first direction. A plurality of control lines extend in a second direction which is perpendicular to the first direction and couple data storage elements along respective rows to one another. A plurality of wordlines extend substantially in parallel with the plurality of control lines. A wordline couples access gates of respective access transistors along a row to one another. Pairs of neighboring control lines alternate with pairs of neighboring wordlines along consecutive rows, and nearest edges of first and second wordlines of a neighboring pair are separated by a first perpendicular distance over an active region and are separated by a second, smaller perpendicular distance over an isolation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flash memory device disposed on a semiconductor substrate, comprising:
   a plurality of flash memory cells arranged in rows and columns, wherein respective flash memory cells include respective access transistors coupled to respective floating gate transistors, and wherein the respective access transistors have respective access gates and wherein respective floating gate transistors have respective control gates arranged over respective floating gates;

a plurality of control lines extending over the semiconductor substrate in a first direction and being coupled to respective control gates of respective floating gate along respective rows;

a plurality of wordlines extending substantially in parallel with the respective control lines and being coupled to respective access gates of respective access transistors along respective rows; and wherein the control lines and wordlines are arranged so pairs of neighboring control lines alternate with pairs of neighboring wordlines, and wherein nearest edges of first and second wordlines of a neighboring pair include a first wing which extends laterally outward from a sidewall of one of the first or second wordlines towards a sidewall the other of the first or second wordlines.

2. The flash memory device of claim 1, wherein a control line couples consecutive control gates along a row to one another, and wherein a wordline couples consecutive access gates along the row to one another.

3. The flash memory device of claim 2, wherein a floating gate and control gate of a flash memory cell are each made of polysilicon and are separated by a dielectric material.

4. The flash memory device of claim 3, wherein the access gate comprises:
   a lower polysilicon layer having a vertical thickness approximately equal to that of the floating gate; and
   an upper polysilicon layer abutting an upper surface of the lower polysilicon layer and having vertical thickness approximately equal to that of the control gate.

5. The flash memory device of claim 1, further comprising:
   a plurality of active regions disposed in the semiconductor substrate and extending in a second direction, which is perpendicular to the first direction, wherein neighboring active regions are spaced apart from one another by respective isolation structures; and
   a contact extending vertically downward to an active region and arranged laterally between the first and second wordlines.

6. The flash memory device of claim 5, wherein the nearest edges of first and second wordlines are separated by a first perpendicular distance measured through the contact and are separated by a second, smaller perpendicular distance when measured at a position other than through the contact.

7. The flash memory device of claim 1, further comprising:
   sidewall spacers that extend along neighboring sidewalls of the first and second wordlines, wherein the sidewall spacers of the first and second wordlines abut one another adjacent to the at least one wing and are spaced apart from one another at a position spaced apart from the first wing.

8. The flash memory device of claim 1, further comprising:
   a second wing which extends laterally outward from the sidewall of the other of the first or second wordline towards the sidewall the other of the first or second wordline.

9. The flash memory device of claim 8, wherein the first and second wings are symmetric with regards to an axis extending equidistantly between the nearest edges of the first and second wordlines.

10. The flash memory device of claim 8, wherein the first and second wings are asymmetric with regards to an axis extending equidistantly between the nearest edges of the first and second wordlines.

11. A memory device disposed on a semiconductor substrate, comprising:
    a plurality of memory cells arranged in rows and columns, wherein respective memory cells include respective access transistors coupled to respective data storage elements, and wherein the respective access transistors have respective access gates;
    a plurality of control lines extending over the semiconductor substrate in a first direction and being coupled to respective data storage elements along respective rows;
    a plurality of wordlines extending substantially in parallel with the respective control lines and being coupled to respective access gates of respective access transistors along respective rows; and
    wherein the control lines and wordlines are arranged so pairs of neighboring control lines alternate with pairs of neighboring wordlines, and wherein nearest edges of first and second wordlines of a neighboring pair include a first wing which extends laterally outward from a sidewall of one of the first or second wordlines towards a sidewall the other of the first or second wordlines.

12. The memory device of claim 11, wherein a data storage element comprises a conductive control gate arranged over a floating gate structure and being isolated from the floating gate structure by a dielectric layer.

13. The memory device of claim 11, wherein the nearest edges of the first and second wordlines include first and second wings which are symmetric with regards to an axis extending equidistantly between the nearest edges of the first and second wordlines.

14. The memory device of claim 11, wherein the nearest edges of the first and second wordlines include first and second wings which are asymmetric with regards to an axis extending equidistantly between the nearest edges of the first and second wordlines.

15. The memory device of claim 11, further comprising:
    a plurality of active regions disposed in the semiconductor substrate and extending in a second direction, which is perpendicular to the first direction, wherein neighboring active regions are spaced apart from one another by respective isolation structures; and
    a contact extending vertically downward to an active region and arranged laterally between the first and second wordlines.

16. The memory device of claim 15, wherein the nearest edges of first and second wordlines are separated by a first perpendicular distance measured through the contact and are separated by a second, smaller perpendicular distance when measured at a position other than through the contact.

17. The memory device of claim 11, further comprising:
    a second wing which extends laterally outward from the sidewall of the other of the first or second wordline towards the sidewall the other of the first or second wordline.

18. A memory device disposed on a semiconductor substrate, comprising:
    a plurality of memory cells arranged in rows and columns, wherein respective memory cells include respective access transistors coupled to respective data storage elements, and wherein the respective access transistors have respective access gates;
    a plurality of wordlines extending over respective rows and being coupled to respective the respective access gates of the respective access transistors along the respective rows; and
    wherein nearest edges of first and second wordlines include a first wing which extends laterally outward from a sidewall of one of the first or second wordlines towards a sidewall the other of the first or second wordlines.

19. The memory device of claim 18, further comprising:
a second wing which extends laterally outward from the sidewall of the other of the first or second wordline towards the sidewall the other of the first or second wordline.

20. The memory device of claim 19, wherein the first and second wings are symmetric with regards to an axis extending equidistantly between the nearest edges of the first and second wordlines.

\* \* \* \* \*